United States Patent
Ueno et al.

(10) Patent No.: US 7,026,063 B2
(45) Date of Patent: Apr. 11, 2006

(54) SPIN-VALVE TYPE MAGNETORESISTANCE SENSOR AND THIN-FILM MAGNETIC HEAD

(75) Inventors: Masaki Ueno, Osaka (JP); Hiroshi Nishida, Osaka (JP); Fuminori Hikami, Hyogo (JP)

(73) Assignee: Western Digital (Fremont), Inc., Fremont, CA (US)

( * ) Notice: Subject to any disclaimer, the term of this patent is extended or adjusted under 35 U.S.C. 154(b) by 296 days.

(21) Appl. No.: 09/816,601

(22) Filed: Mar. 23, 2001

(65) Prior Publication Data

US 2002/0004147 A1    Jan. 10, 2002

(30) Foreign Application Priority Data

Apr. 11, 2000  (JP)  ............... 2000-109442

(51) Int. Cl.
  *G11B 5/33*  (2006.01)
  *G11B 5/127*  (2006.01)

(52) U.S. Cl. .................. 428/815; 428/811; 360/324.12

(58) Field of Classification Search ............... 428/64.2, 428/692, 694 R, 694 DE, 694 XS, 694 RL, 428/694 MM, 694 EC, 694 IS, 694 TM, 428/694 BS, 639, 687, 336, 693, 694 T, 694 TP, 428/692.1, 693.1, 810, 811, 816, 815; 360/324.1, 360/324.11, 324.12, 131, 136, 324, 313
See application file for complete search history.

(56) References Cited

U.S. PATENT DOCUMENTS

| | | | |
|---|---|---|---|
| 5,422,571 A | 6/1995 | Gurney et al. | |
| 6,181,534 B1 * | 1/2001 | Gill | 360/324.11 |
| 6,201,673 B1 | 3/2001 | Rottmayer et al. | 360/324.12 |
| 6,219,208 B1 * | 4/2001 | Gill | 360/324.1 |
| 6,271,997 B1 | 8/2001 | Gill et al. | 360/324.1 |
| 6,313,973 B1 | 11/2001 | Fuke et al. | 360/324.1 |
| 6,338,899 B1 * | 1/2002 | Fukuzawa et al. | 428/694 TM |

(Continued)

FOREIGN PATENT DOCUMENTS

EP    0 611 033 A2    1/1994

(Continued)

OTHER PUBLICATIONS

Kamiguchi, Y., et al., CoFe Specular Spin Valves with a Nano Oxide Layer; Digests of INTERMAG 99; 1999 IEEE International Magnetics Conference Digest of Technical Papers.

*Primary Examiner*—Stevan A. Resan
*Assistant Examiner*—Louis Falasco
(74) *Attorney, Agent, or Firm*—Burgess & Bereznak LLP; Joshua C. Harrison, Esq.

(57) ABSTRACT

A method and apparatus of a spin-type magnetoresistance sensor having a free and pinned magnetic layer stacked with a non-magnetic interposed layer are disclosed. Specifically, the spin-valve type magnetoresistance sensor of the present invention is equipped with a free ferromagnetic layer, a pinned ferromagnetic layer, a non-magnetic spacer layer which is sandwiched between the aforementioned ferromagnetic layers, an anti-ferromagnetic layer which is disposed adjacent to the aforementioned pinned ferromagnetic layer and which is used to pin the direction of magnetization of said pinned ferromagnetic layer, a non-magnetic back layer which is disposed adjacent to the aforementioned free ferromagnetic layer and which is stacked on the opposite side the free ferromagnetic layer from the aforementioned non-magnetic spacer layer, and an electron-reflective layer which is disposed adjacent to the aforementioned back layer and which is stacked on the opposite side of the back layer from the aforementioned free ferromagnetic layer.

7 Claims, 8 Drawing Sheets

U.S. PATENT DOCUMENTS 6,348,274 B1 * 2/2002 Kamiguchi et al. ......... 428/692
6,567,246 B1 * 5/2003 Sakakima et al. ..... 360/324.11
2001/0046110 A1 * 11/2001 Kawawake et al. .... 360/324.12

FOREIGN PATENT DOCUMENTS

WO     WO 94/11889     11/1993

* cited by examiner

SPIN-VALVE TYPE MAGNETORESISTANCE SENSOR AND THIN-FILM MAGNETIC HEAD

This application claims the benefit of the filing date of the Japanese Application No.: 2000-109442 dated Apr. 11, 2000: "SPIN-VALVE TYPE MAGNETORESISTANCE SENSOR AND THIN-FILM MAGNETIC HEAD". This application is also related to copending application Ser. No. 09/670,309 filed Sep. 26, 2000.

FIELD OF THE INVENTION

The present invention pertains to the field of magnetic recording. More particularly, the present invention relates to a thin-film head with a spin-valve type magnetoresistance sensor.

BACKGROUND OF THE INVENTION

The demand for magnetic disk storage capability continues to increase. This has resulted in increased storage density on disks. Increased storage density generally results in a decreased signal level from, for example, a reading head. Therefore, a magnetic head which has increased output may be beneficial.

In the past, magnetic resistance sensors with a spin-valve film structure that have shown a large magnetic resistance effect (spin-valve MR sensors) have been developed in order to increase the output by increasing the magnetic field sensitivity, and thus possibly achieve a further increase in the magnetic recording density, in playback magnetic heads.

Generally, spin-valve MR films consist of a sandwich structure in which two facing ferromagnetic layers are stacked with a non-magnetic spacer layer consisting of a conductive metal sandwiched in between. The magnetization of one of the ferromagnetic layers is fixed in the direction parallel to the signal magnetic field by the exchange-coupling magnetic field with the adjacent antiferromagnetic layer, while the magnetization of the other ferromagnetic layer is generally formed into a single magnetic domain by a hard bias method utilizing the magnetic field of a permanent magnet, and rotates freely in accordance with variations in the external magnetic field. The ferromagnetic layer whose direction of magnetization is fixed is called a pinned layer or pinned ferromagnetic layer, and the ferromagnetic layer whose magnetization rotate freely is called a free layer or free ferromagnetic layer.

When the magnetization of the free layer is caused to rotate by the external magnetic field from a magnetic recording medium, etc., the magnetic resistance of the spin-valve film varies according to the angular difference in the direction of magnetization that is generated between the two magnetic layers. Data recorded on a magnetic recording medium such as a magnetic disk, etc., can be recognized by sensing this variation in the magnetic resistance. For example, the principle of such a spin-valve sensor is also disclosed in detail in Japanese Patent Publication No. 8-503336 (PCTIUS93/10782).

Reducing the film thickness of the free layer so that the coercive force of said free layer is lowered is an effective means of increasing the sensitivity of a spin-valve film. However, if the film thickness of the free layer is reduced to a value of 3.0 to 5.0 nm, which is comparable to the mean free path of the conductive electrons, the magnetic resistance variation rate (MR ratio) drops.

Recently, in order to solve this problem, a method in which the MR ratio is increased by forming a non-magnetic metal layer (back layer) so that this metal layer is adjacent to the surface of the free layer on the opposite side from non-magnetic spacer layer, this extending the mean free path of the conductive electrons, has been investigated (for example, in Japanese Patent No. 2744883).

Furthermore, as a separate method, a spin-valve film in which an oxide layer that reflects electrons is stacked in the pinned layer and adjacent to the free layer on the opposite side from the non-magnetic spacer layer has been proposed in a paper by Y. Kamiguchi et al. ("Co ALLOY SPECULAR SPIN VALVES WITH A NANO OXIDE LAYER" (IEEE, INTERMAG 99, DB-01 (1999)). In this film, conductive electrons are mirror-reflected by the interface between the oxide layer and the metal layer; accordingly, the energy loss of the conductive electrons when the electrons are reflected at the interface is small, and the quantitative ratio of the conductive electrons that are discriminated by the spin-valve effect is large. As a result, the MR ratio is increased and the sensitivity of the sensor is improved, so that a high recording density can be achieved.

However, when an oxide layer that reflects conductive electrons is stacked directly adjacent to the free layer as described in the abovementioned paper, the soft magnetic characteristics deteriorate (e.g., the coercive force of the free layer is increased, etc.) as a result of the diffusion of oxygen from the oxide layer, etc. In the abovementioned paper, the coercive force is actually large, i.e., 14 Oe, so that the sensor is unsuitable as a magnetic sensor. Such a deterioration in the soft magnetic characteristics causes instability in the head output and output asymmetry, as well as base line noise, etc.

On the other hand, in the case of a spin-valve MR sensor in which a non-magnetic back layer is stacked adjacent to the free layer, almost all of the conductive electrons that reach the non-magnetic back layer from the free layer move outside the region of the spin-valve effect created by the change in the relative angle of magnetization of the pinned ferromagnetic layer and the free ferromagnetic layer. If such conductive electrons that are not closely related to the magnetic resistance effect could be utilized, it would appear that a much greater increase in the MR ratio could be achieved.

Accordingly, in view of the abovementioned conventional problems, the ability to provide a spin-valve type magnetoresistance sensor in which the magnetic sensitivity of the sensor can be increased so that a high output can be obtained, and in which instability in the head output and output asymmetry, as well as base line noise, etc., can be suppressed so that the characteristics of the sensor can be stabilized may be beneficial.

Furthermore, the ability to provide a thin-film magnetic head which stably exhibits high performance that can handle a great increase in capacity and an increase in recording density in magnetic recording, and which can also be manufactured at a good yield, as a result of being equipped with such a spin-valve type magnetoresistance sensor may also be beneficial.

SUMMARY OF THE INVENTION

A method and apparatus for a spin-valve type magnetoresistance sensor having a free and pinned magnetic layer stacked with a non-magnetic interposed layer are disclosed.

Other features of the present invention will be apparent from the accompanying drawings and from the detailed description that follows.

BRIEF DESCRIPTION OF THE DRAWINGS

The present invention is illustrated by way of example and not limitation in the figures of the accompanying drawings. Likewise, references indicate similar elements.

DETAILED DESCRIPTION

Figure 1:
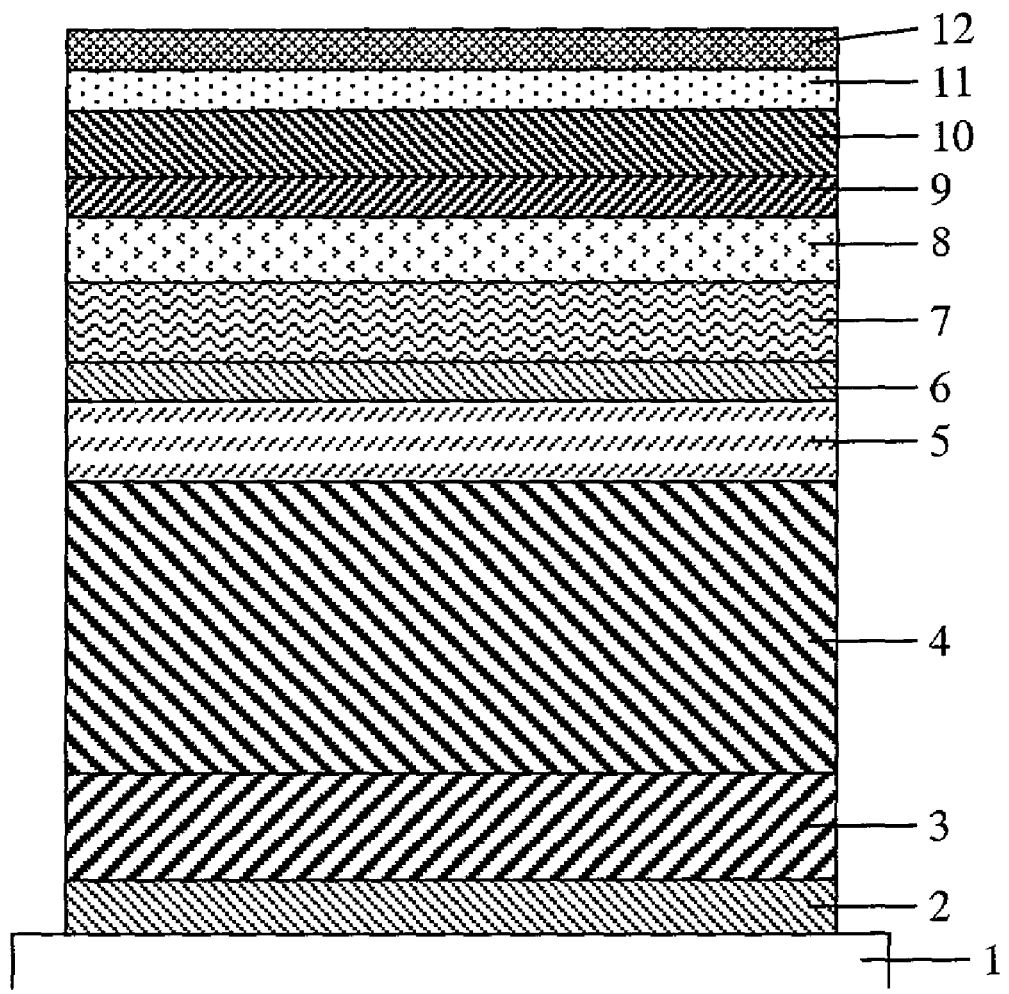
FIG. 1 is a model structural diagram which shows a spin-valve type magnetoresistance sensor constituting an embodiment of the present invention in model form.

A method and apparatus for a magnetoresistance sensor are described. For purposes of discussing and illustrating the invention, several examples will be given in the context of a thin-film magnetic head. However, one skilled in the art will recognize and appreciate that the sensor may be used for sensing magnetic flux for other uses, for example, to sense voids in structures by inducing eddy currents in a material.

In the following description, for purposes of explanation, numerous specific details are set forth in order to provide a thorough understanding of the present invention. It will be evident, however, to one skilled in the art that the present invention may be practiced without these specific details. In some instances, well-known structures and devices are shown in block diagram form, rather than in detail, in order to avoid obscuring the present invention. These embodiments are described in sufficient detail to enable those skilled in the art to practice the invention, and it is to be understood that other embodiments may be utilized and that logical, mechanical, electrical, and other changes may be made without departing from the scope of the present invention.

Specifically, the spin-valve type magnetoresistance sensor of the present invention is equipped with a free ferromagnetic layer, a pinned ferromagnetic layer, a non-magnetic spacer layer which is sandwiched between the aforementioned ferromagnetic layers, an anti-ferromagnetic layer which is disposed adjacent to the aforementioned pinned ferromagnetic layer and which is used to pin the direction of magnetization of said pinned ferromagnetic layer, a non-magnetic back layer which is disposed adjacent to the aforementioned free ferromagnetic layer and which is stacked on the opposite side the free ferromagnetic layer from the aforementioned nonmagnetic spacer layer, and an electron-reflective layer which is disposed adjacent to the aforementioned back layer and which is stacked on the opposite side of the back layer from the aforementioned free ferromagnetic layer. Such a spin-valve type magnetoresistance sensor may be part of a thin-film magnetic head, and may be used in a magnetic recording device, such as a disk drive.

Since the spin-valve type magnetoresistance sensor of the present invention is equipped with a back layer, the mean free path of the conductive electrons is extended, so that the conductance of the sensor and the magnetic resistance effect ratio (MR ratio) are increased. Furthermore, as a result of the electron-reflective layer, at least some of the conductive electrons that move from the free ferromagnetic layer to the opposite side [of the free ferromagnetic layer] from the spacer layer are mirror-reflected by the interface between the electron-reflective layer and the back layer, and some of these reflected electrons contribute to an increase in the magnetic resistance effect based on the spin-valve effect, so that a further increase in the MR ratio is achieved. Furthermore, even in cases where the electron-reflective layer is constructed from an oxide insulating layer that has a high electron reflection efficiency, the back layer functions as an anti-oxidation layer, and since the oxide insulating layer that reflects the conductive electrons and the free ferromagnetic layer are not in direct contact with each other, a deterioration in the soft magnetic characteristics caused by the oxidation of the free ferromagnetic layer can be avoided. Furthermore, since this structure is also a so-called spin-filter structure which is equipped with a non-magnetic conductive back layer, the following advantage is also simultaneously obtained: specifically, the bias current center moves from the non-magnetic spacer layer toward the free layer, so that the bias current magnetic field in the free layer is reduced, thus reducing the asymmetry of the output.

The abovementioned electron-reflective layer, in one embodiment, may consist of a metal oxide which is formed by forming a film of a metal that is more easily oxidized than the constituent material of the back layer on the surface of the back layer, and oxidizing this intermediate-product metal layer in an oxidizing atmosphere. In this way, an elastic mirror reflection of conductive electrons by an electron-reflective layer consisting of a metal oxide is obtained. Furthermore, since the electron-reflective layer is obtained by first forming an intermediate-product metal layer which is a non-oxide, and then naturally oxidizing this intermediate-product metal layer, an electron-reflective layer consisting of a metal oxide can be formed while preventing the oxidation of the free ferromagnetic layer and back layer in the manufacturing process. Furthermore, by using a metal that is more easily oxidized than the constituent material of the back layer (e.g., copper, etc.) as the constituent metal of the electron-reflective layer, it is possible to suppress a drop in conductance caused by the oxidation of the back layer over time. The relative ease of oxidation of an element generally corresponds to the ionization tendency of the element. Accordingly, it is desirable to form the abovementioned intermediate-product metal layer from a metal that shows a greater tendency toward ionization than the constituent metal of the abovementioned back layer, and to subject this intermediate-product metal layer to natural oxidation.

Furthermore, in an embodiment, it is desirable that the film thickness of the abovementioned intermediate-product metal layer be set at 0.50 to 1.75 nm. If this thickness is less than 0.50 nm, the layer may not function adequately as an electron-reflective layer; furthermore, control of the film thickness is difficult, and the output characteristics following the subsequent oxidation process may be unstable, thus causing a drop in the yield. On the other hand, if this thickness exceeds 1.75 nm, it may be difficult to cause complete oxidation of the constituent metal, and in cases where the metal is not completely oxidized, the sectional structure of the electron-reflective layer becomes a two-layer structure consisting of a metal oxide layer and a metal layer. The electron-reflective layer is intrinsically formed from a highly insulating material and installed in order to reflect electrons; however, in the case of a two-layer structure of the type described above, the portion that is adjacent to the back layer becomes a metal layer, so that the electrical resistance drops compared to that of an oxide layer, thus resulting in a certain degree of current flow. Specifically, conductive electrons may enter the metal layer that constitutes the interface with the back layer, so that the layer cannot function completely as an electron-reflective layer.

The abovementioned back layer may be formed from a metal that has the property of acting as an oxidizing agent with respect to the electron-reflective layer. A typical example of such a metal is copper (Cu); if the back layer is formed from copper, the effect in extending the mean free path of the conductive electrons is large, so that the conductance and MR ratio can be increased. Furthermore, if the film thickness of the non-magnetic back layer is less than 0.5 nm, the layer does not function sufficiently as a back layer, so that no great change is seen in the MR ratio. On the other hand, if this thickness exceeds 1.5 nm, the shunt loss of the conductive electrons is large, so that the MR ratio may conversely drop. Accordingly, in this embodiment, it is desirable that this thickness be in the range of 0.5 to 1.5 nm.

In the abovementioned embodiment of the spin-valve type magnetoresistance sensor, even in cases where the film thickness of the free ferromagnetic layer is reduced to a value that is comparable to the mean free path of the conductive electrons in said ferromagnetic layer (e.g., approximately 3 to 5 nm), the mean free path of the conductive electrons can be increased by the back layer. Furthermore, the conductive electrons are reflected by the electron-reflective layer so that an effective contribution to the spin-valve effect can be made, thus making it possible to obtain a large MR ratio while achieving a further increase in the sensitivity of the sensor. Moreover, a deterioration in the soft magnetic characteristics of the free ferromagnetic layer can be prevented, so that the stability of the head output and output asymmetry can be improved, and base line noise can be reduced. Accordingly, the film thickness of the free ferromagnetic layer can be made smaller than the mean free path of the conductive electrons in the ferromagnetic layer, so that the magnetic recording density of the magnetic recording device may be further increased.

Furthermore, an embodiment of the present invention in a the thin-film magnetic head using the abovementioned spin-valve type magnetoresistance sensor as a playback magnetic flux sensing element may be preferably realized as a shielded magnetic resistance effect type head. As a result, since the soft magnetic characteristics of the free ferromagnetic layer are favorable, the head characteristics are also stabilized, and a high playback output can be obtained, so that the realization of a hard disk drive with a recording density on the order of 100 Gbits/inch$^2$ or greater may be made.

The present invention may be used in a spin-valve MR sensor of any configuration that has a free ferromagnetic layer, a non-magnetic conductive spacer layer, a pinned ferromagnetic layer and an anti-ferromagnetic layer. The present invention may be used in both so-called bottom spin-valve films, and top spin-valve films in which the anti-ferromagnetic layer is located on the opposite side of the substrate with both ferromagnetic layers interposed. Furthermore, the spin-valve MR sensor of the present invention may also be used in the magnetic heads of magnetic recording devices such as hard disks, etc., and can be used as a magnetism-sensing element in various other types of devices.

A ferromagnetic alloy such as NiFe or CoFe, etc., may be used as the free ferromagnetic layer. In one embodiment, a two-layer film of NiFe/CoFe may be used, with the CoFe stacked on the non-magnetic spacer layer. This embodiment, may be preferable, because: in the case of a spin-valve film which uses Cu in the non-magnetic spacer layer and NiFe in the ferromagnetic layers, the Ni in the NiFe becomes mixed with the Cu when the film is heated to a temperature of 200° C. or greater as a result of heat treatment during the manufacturing process or the generation of heat during operation, etc., such that the multilayer structure may be disturbed. On the other hand, CoFe has a relatively large coercive force, so that it is difficult for the magnetization of the free ferromagnetic layer to rotate. Accordingly, by stacking NiFe (which has a small coercive force) with CoFe as described above, and increasing the film thickness of the NiFe film to some extent, it is possible to facilitate the rotation of the direction of magnetization of the CoFe film, which has a large coercive force.

An IB transition metal such as Cu, Ag or Au, etc., may be used as the nonmagnetic spacer layer. Such metals are superior in terms of conductivity, and exhibit a sufficient function as a spacer layer.

Various materials such as Mn type anti-ferromagnetic materials, Cr type anti-ferromagnetic materials or oxide type anti-ferromagnetic materials, etc., may be used for the anti-ferromagnetic layer.

PtMn, PdMn and NiMn, which are Mn type anti-ferromagnetic materials, are anti-ferromagnetic regular alloys that have a CuAu—I type crystal structure. These alloys are known to show a large exchange-coupling magnetic field at an Mn content of 50%. Furthermore, IrMn, RhMn and FeMn are anti-ferromagnetic irregular alloys that have a fcc (face-centered cubic) structure, and are known to impart unidirectional anisotropy to the pinned layer without heat treatment. Moreover, CrMn is an anti-ferromagnetic alloy that has a bcc (body-centered cubic) structure. In addition, PdPtMn alloys and CrPtMn alloys, etc., are also known to show a large exchange-coupling magnetic field, a high blocking temperature and good corrosion resistance.

CrAl is an example of a Cr type anti-ferromagnetic material. CrAl is an anti-ferromagnetic irregular alloy, which has a bcc structure. This alloy shows a high Neel temperature, a high electrical resistivity and high corrosion resistance; furthermore, unidirectional anisotropy is generated without heat treatment.

Oxides such as α-Fe2O3, NiO and CoO, etc., are examples of oxide type anti-ferromagnetic materials, as is a two-layer film of NiO/CoO. These oxides are superior in terms of corrosion resistance, and since these oxides are insulators, they have a high resistivity, so that there is little shunt loss of the sensing current. Accordingly, such oxides may be advantageous for achieving a high output.

The non-magnetic back layer may be formed from a non-magnetic conductive material such as Cu, etc.; this layer may also be formed by multi-layer films. Such a two-layer film, is that of Cu/Ru.

It may be desirable that the electron-reflective layer be formed from a tantalum oxide layer because this tantalum oxide can be manufactured from metallic tantalum by natural oxidation. As such, the tantalum oxide is an insulator and accordingly, this oxide is suitable as an electron-reflective layer. Furthermore, if the film thickness of the metallic tantalum layer that is formed during the manufacture of the aforementioned tantalum oxide layer is 0.5 nm to 1.75 nm, the oxidation residue of the metallic tantalum layer is small and the electron reflectivity is high, so the MR ratio is increased.

Various other materials besides the abovementioned tantalum oxide may be used as the aforementioned electron-reflective layer. Metal oxides such as zirconium oxide, titanium oxide, hafnium oxide, silicon oxide, aluminum oxide, germanium oxide and zinc oxide, etc., which can be manufactured by natural oxidation, and semiconductors with a large band gap such as diamond, silicon carbide and zinc sulfide, etc., have a large potential barrier at the metal interface, and are advantageous for increasing the electron reflectivity.

Furthermore, the present invention may be realized as a thin-film magnetic head which is equipped with the abovementioned spin-valve type magnetoresistance sensor as a playback magnetic flux sensing element. Since the soft magnetic characteristics of the free ferromagnetic layer of the spin-valve film in such a thin-film magnetic head are desirable, the head characteristics are stabilized, and a high playback output may be obtained at the same time. Such a thin-film magnetic head is advantageous for use in a magnetic recording device such as a hard disk, etc.

One embodiment of the present invention is illustrated by the cross-sectional view of the structure 100 in FIG. 1. 1 represents a substrate; 2 represents a first underlayer; 3 represents a second underlayer; 4 represents an anti-ferromagnetic layer; 5, 6, and 7 represent a pinned ferromagnetic structure; 8 represents a non-magnetic spacer; 9 and 10 represent a free ferromagnetic structure; 11 represents a non-magnetic back layer; and 12 represents an electron-reflective layer.

It is to be understood that a layer may be formed by a film or other method and that a structure may be a series of layers and/or films. Thus, the use of the words "film" and/or "layer" may be considered synonymous as representing a material thickness, consistent with the standard definition of a film as a thin layer.

The construction of a spin-valve MR sensor applying the present invention as is illustrated in FIG. 1 may be as follows: In this embodiment of a spin-valve MR sensor, an underlayer with a two-layer structure constructed from a first underlayer film 2 consisting of Ta and a second underlayer film 3 consisting of NiFeCr is formed on the surface of a substrate 1 consisting of glass, silicon, or ceramic material, such as, Al-103/TiC, etc., in order to increase the crystal orientation of the overall film formed above. An MR film is formed on top of this underlayer by stacking various types of constituent layers.

This MR film is a film known as a synthetic spin-valve film in which a pinned layer with a three-layer structure constructed from a ferromagnetic film 5 consisting of a Co alloy, a non-magnetic film 6 consisting of Ru and a ferromagnetic film 7 consisting of a Co alloy is formed on the surface of an anti-ferromagnetic layer film 4 consisting of a PtMn film, which is in turn formed on the surface of the aforementioned underlayers 2 and 3. Both of the aforementioned ferromagnetic films 5 and 7 are magnetically integrated by strong anti-parallel coupling. As a result, the exchange-coupling with the antiferromagnetic layer 4 is strengthened so that the operation of the sensor is stabilized, and the static magnetic field that reaches the free layer from the pinned layer is reduced, so that the asymmetry of the playback output is improved.

A non-magnetic conductive spacer layer 8 consisting of a Cu film is formed on the surface of the aforementioned pinned layer; furthermore, a free layer with a two-structure consisting of a Co alloy film 9 and an NiFe film 10 is stacked on the surface of the aforementioned spacer layer 8. In this embodiment, the aforementioned free layer is formed with a smaller thickness than in a conventional spin-valve film in order to obtain a high magnetic field sensitivity.

An electron-reflective layer 12 is stacked on the surface of the free layer with a back layer 11 consisting of Cu or a two-layer structure of Cu/Ru interposed. As a result of an electron-reflective layer 12 thus being stacked on the uppermost surface, the conductive electrons are reflected by the interface with this electron-reflective layer 12. Here, if the mean free path of the conductive electrons is defined as the sum of the rectilinear distances traveled by the electrons before and after mirror reflection, then the mean free path of the conductive electrons is increased as a result of the presence of the electron-reflective layer 12 in the spin-valve film of the present embodiment, so that the MR ratio is increased. Accordingly, a high playback output may be obtained. Furthermore, in cases where an oxide such as a tantalum oxide layer, etc., is used as the electron-reflective layer 12, deterioration of the soft magnetic characteristics of the free layer may be avoided, since this electron-reflective layer 12 does not directly contact the free layer. Accordingly, the head characteristics are more stable.

The abovementioned tantalum oxide is formed by stacking a metallic tantalum film, and then oxidizing this metallic tantalum film in an oxidizing atmosphere (e.g., exposing the film to the atmosphere). In this case, the tantalum is stacked with the metallic tantalum layer controlled to an appropriate film thickness so that there is no oxidation residue; as a result, substantially all of the metallic tantalum is converted into a tantalum oxide layer.

The aforementioned MR film is subjected to a specified heat treatment in a vacuum magnetic field following film formation, so that the anti-ferromagnetic layer 4 is regularized, thus imparting unidirectional anisotropy to the aforementioned pinned layer by exchange-coupling, so that the magnetic orientation is fixed.

A similar effect may be obtained by selecting a material having high insulating oxides such as zirconium oxide, titanium oxide, hafnium oxide, silicon oxide, aluminum oxide and germanium oxide, etc., and semiconductors with a large band gap such as zinc oxide, diamond, silicon carbide, and zinc sulfide, etc., as the material of the electron-reflective layer 12 instead of tantalum oxide.

Figure 3:
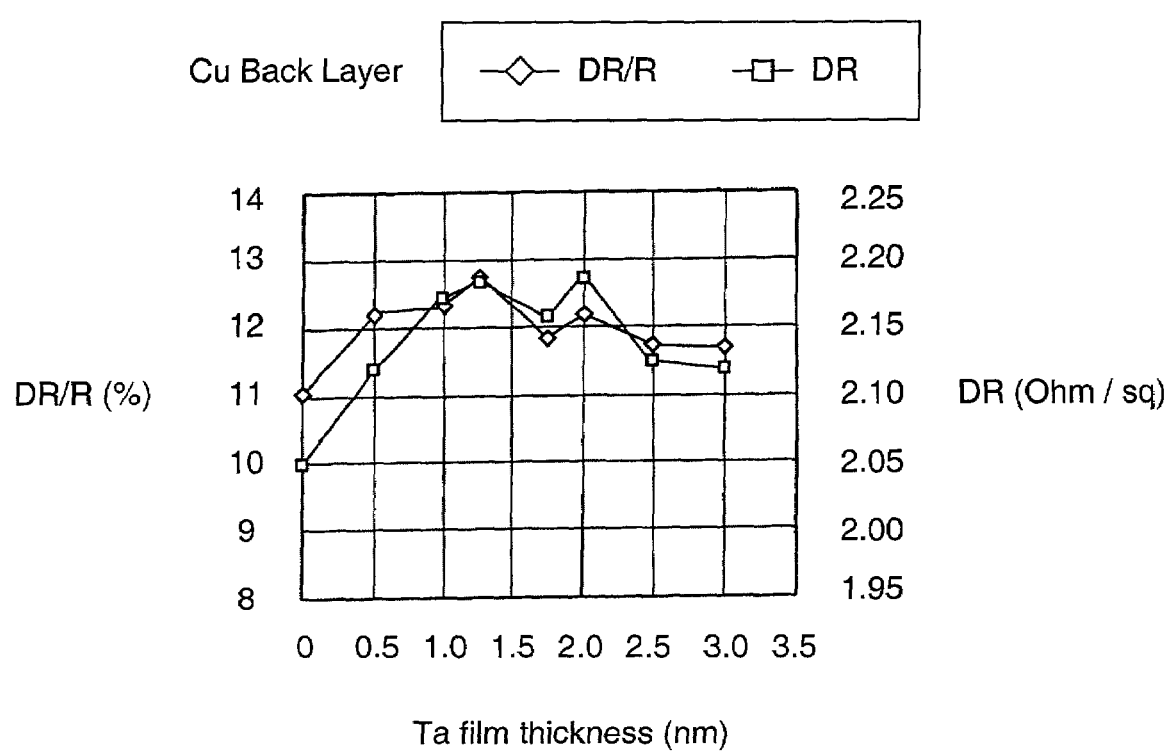
FIG. 3 is a graph which shows the relationship of the film thickness of the electron-reflective layer in a case where the back layer is constructed from copper to the amount of change in the magnetic resistance and the rate of change of the magnetic resistance.
Figure 4:
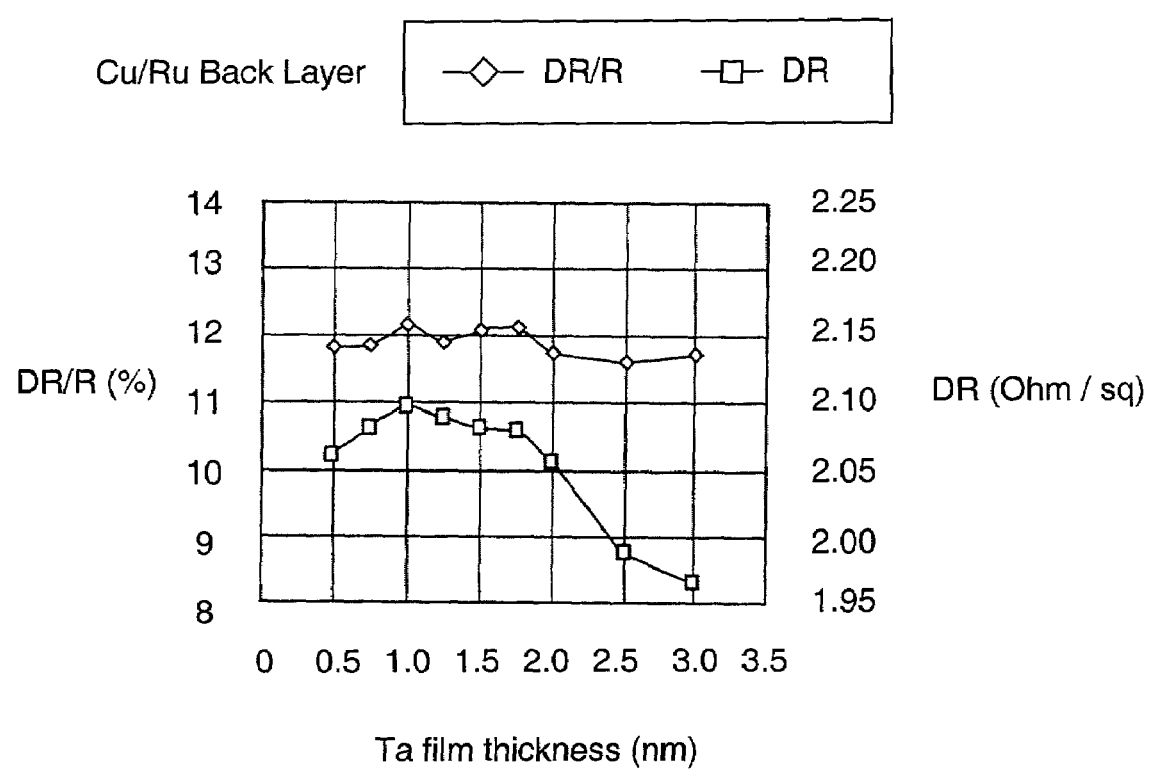
FIG. 4 is a graph which shows the relationship of the film thickness of the electron-reflective layer in a case where the back layer is constructed from a two layer film of copper and ruthenium to the amount of change in the magnetic resistance and the rate of change of the magnetic resistance.

The spin-valve MR film shown in FIG. 1, with a layer construction consisting of Ta (1.5 nm)/NiFeCr (4.0 nm)/PtMn (10.0 nm)/Co alloy (2.0 nm)/Ru (0.85 nm)/Co alloy (2.6 nm)/Cu (2.1 nm)/Co alloy (1.0 nm)/NiFe (2.0 nm)/back layer/electron-reflective layer may be formed on a substrate by DC magnetron sputtering, and following this film formation, a heat treatment for approximately 10 hours at approximately 270° C. in an 11-kilogauss vacuum magnetic field with the film exposed to the atmosphere. In this embodiment, the back layer may consist of Cu or Cu/Ru, and the electron-reflective layer 12 may consist of tantalum oxide which was formed by natural oxidation following the formation of a metallic tantalum film. Changes in the sheet resistance and MR effect with respect to the film thickness Ta of the tantalum oxide layer were measured for such an embodiment. The results obtained are shown in FIG. 2 through 4.

Figure 2:
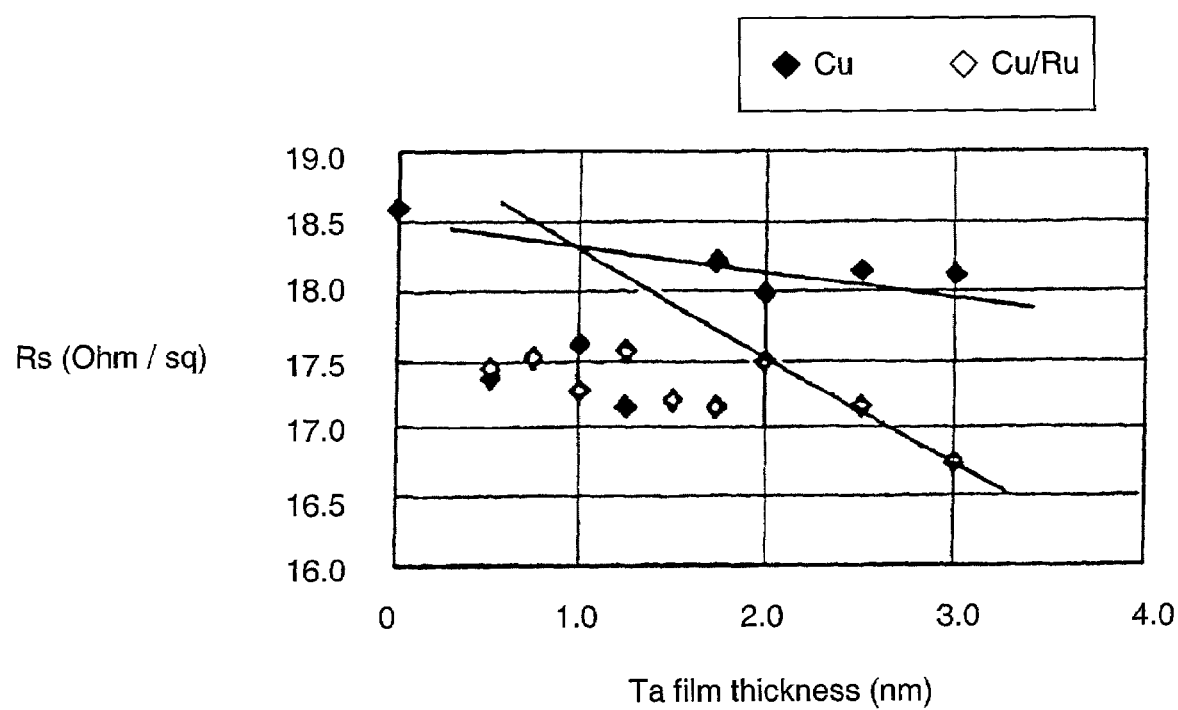
FIG. 2 is a graph which shows the relationship between the film thickness of the electron-reflective layer and the sheet resistance in one embodiment of a sensor.

FIG. 2 shows the results obtained for the sheet resistance. At a tantalum thickness of 2.0 to 3.0 nm, the sheet resistance rises with a decrease in the film thickness, which agrees with the general tendency. However, at a tantalum thickness of 0.5 to 1.75 nm, the results disagree with this tendency, and show values that are approximately 0.5 to 1.5 ohms lower than expected. This suggests that the mean free path of the conductive electrons is extended by the electron-reflective layer, so that the sheet resistance of the spin-valve film shows a drop. FIGS. 3 and 4 show the MR ratio (DR/R) and change in resistance (DR) for respective back layers of Cu and Cu/Ru. In FIGS. 3 and 4, the film thicknesses at which the MR ratio and change in resistance are large more or less agree with the regions where the sheet resistance drops; thus, an improvement in the MR effect resulting from the electron-reflective effect of the tantalum oxide layer is seen.

Figure 5:
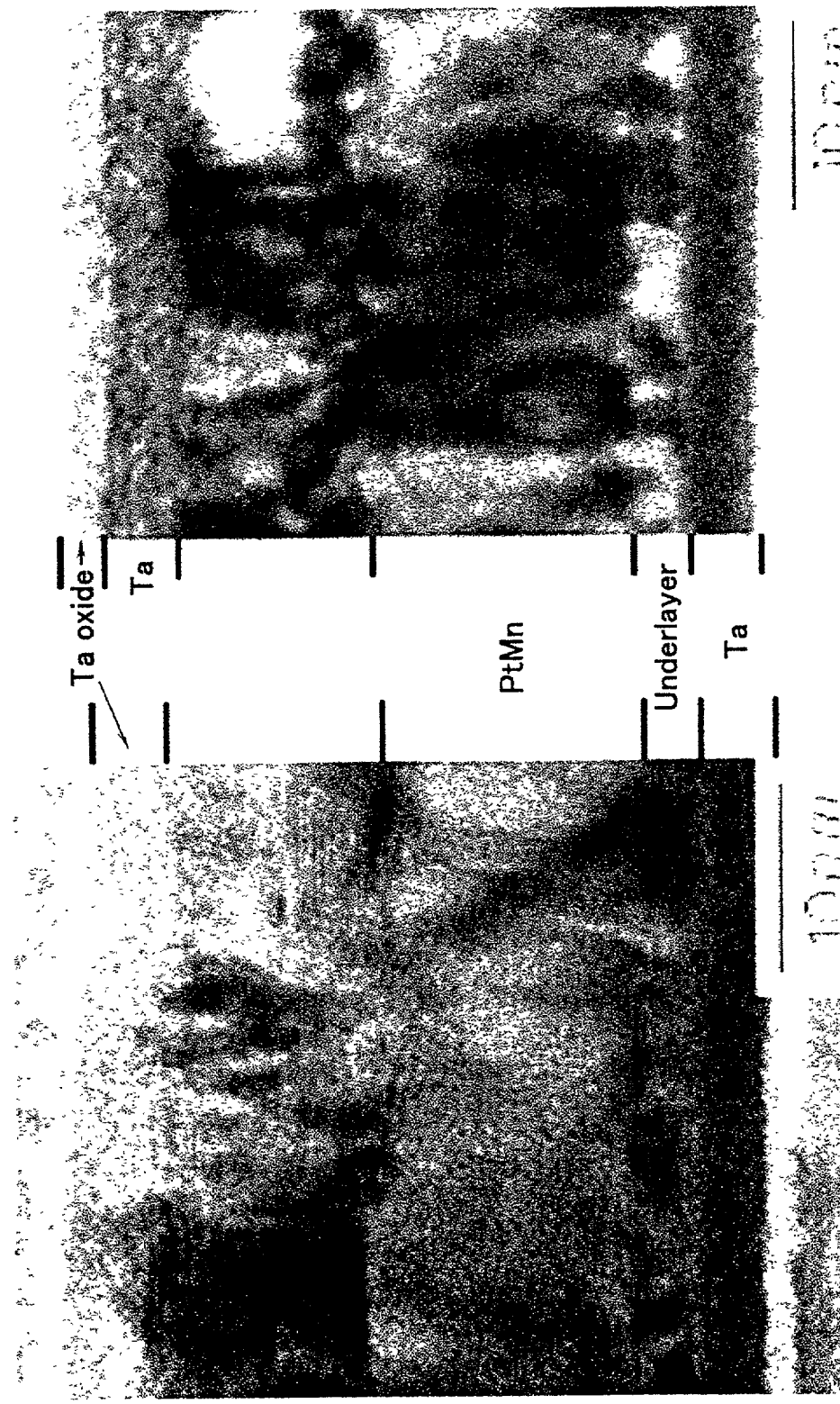
FIG. 5 shows sectional electron micrographs that illustrate the oxidized state in cases where the film thickness of the electron-reflective layer was respectively set at 1.0 nm and 3.0 nm.

FIG. 5 shows sectional transmission electron micrographs of the abovementioned spin-valve films. It is seen that in a film in which the metallic tantalum layer was formed with a film thickness of 3.0 nm, a two-layer structure consisting of a metallic tantalum layer and a tantalum oxide layer was formed following natural oxidation, while in a film in which the metallic tantalum layer was formed with a film thickness of 1.0 nm, all of the metallic tantalum layer was converted into tantalum oxide following natural oxidation.

Figure 6:
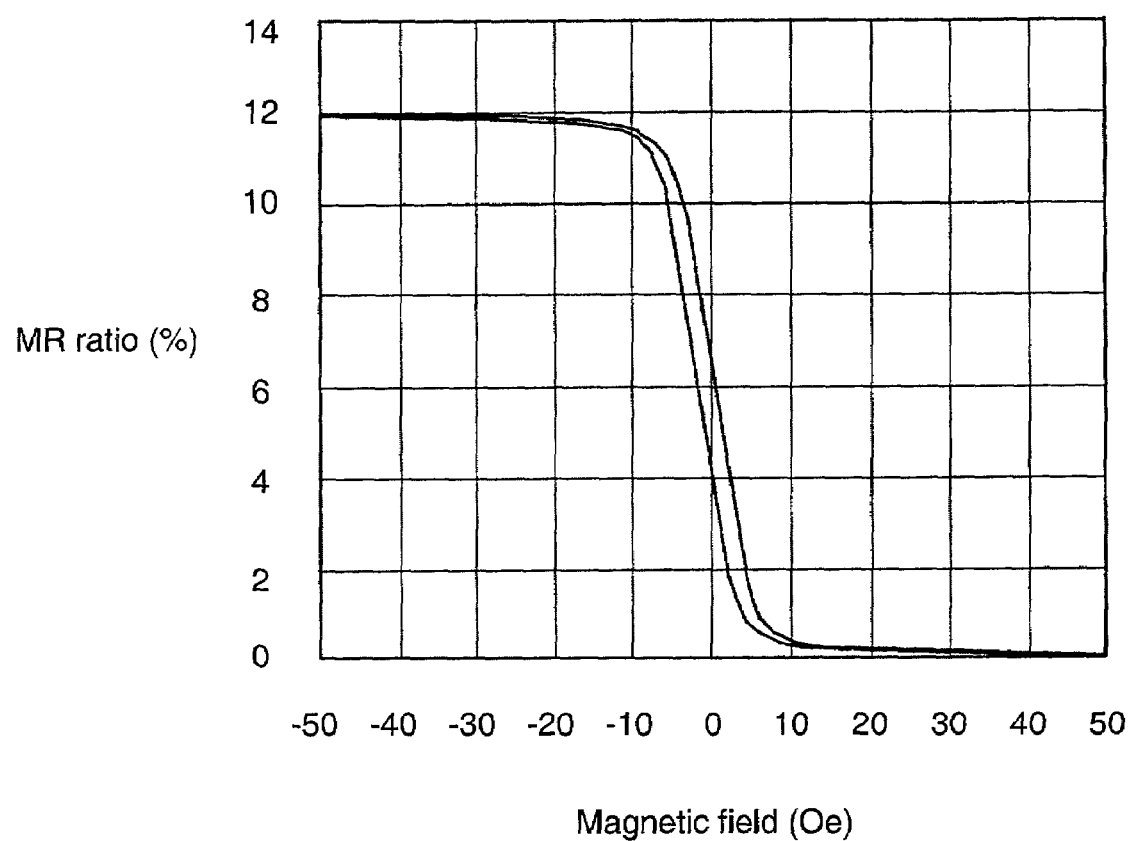
FIG. 6 is a graph which shows the MR—magnetic field curve of a spin-valve type magnetoresistance sensor constituting one embodiment of the present invention.

FIG. 6 shows the MR—magnetic field curve of the spin-valve film of the present invention in this embodiment. The coercive force read from this curve is extremely small, i.e., approximately 1.2 Oersted, thus indicating that the soft magnetic characteristics of the free layer are good.

Furthermore, in order to confirm the Cu back layer film thickness dependence, numerous samples were prepared which had a film structure of Ta (3.0 nm)/NiFeCrTi (4.0 mn)/PtMn (15.0 nm)/CoFe (2.0 nm)/Ru (8.5 nm)/CoFe (2.5 nm)/Cu (2.3 nm)/CoFe (1.0 nm)/NiFe (2.0 nm)/Cu back layer/Ta electron-reflective layer on an Si substrate, and in which the film thickness of the back layer was varied from 0 to 4.0 nm in 0.5 nm increments, and the film thickness of the intermediate-product metal layer (Ta film) of the electron-reflective layer was set at 1.25 nm or 3.0 nm. Following film formation, these samples were subjected to a heat treatment for 10 hours at 270° C., and the MR ratios and amounts of change in conductance (ΔG) of these samples were determined by experiment. Furthermore, the sheet resistance of the spin-valve films was measured by the four-terminal resistance measurement method, and it was confirmed by the fluorescent X-ray measurement method (XRF) that the film thicknesses of the respective layers were accurate film thicknesses.

Figure 7:
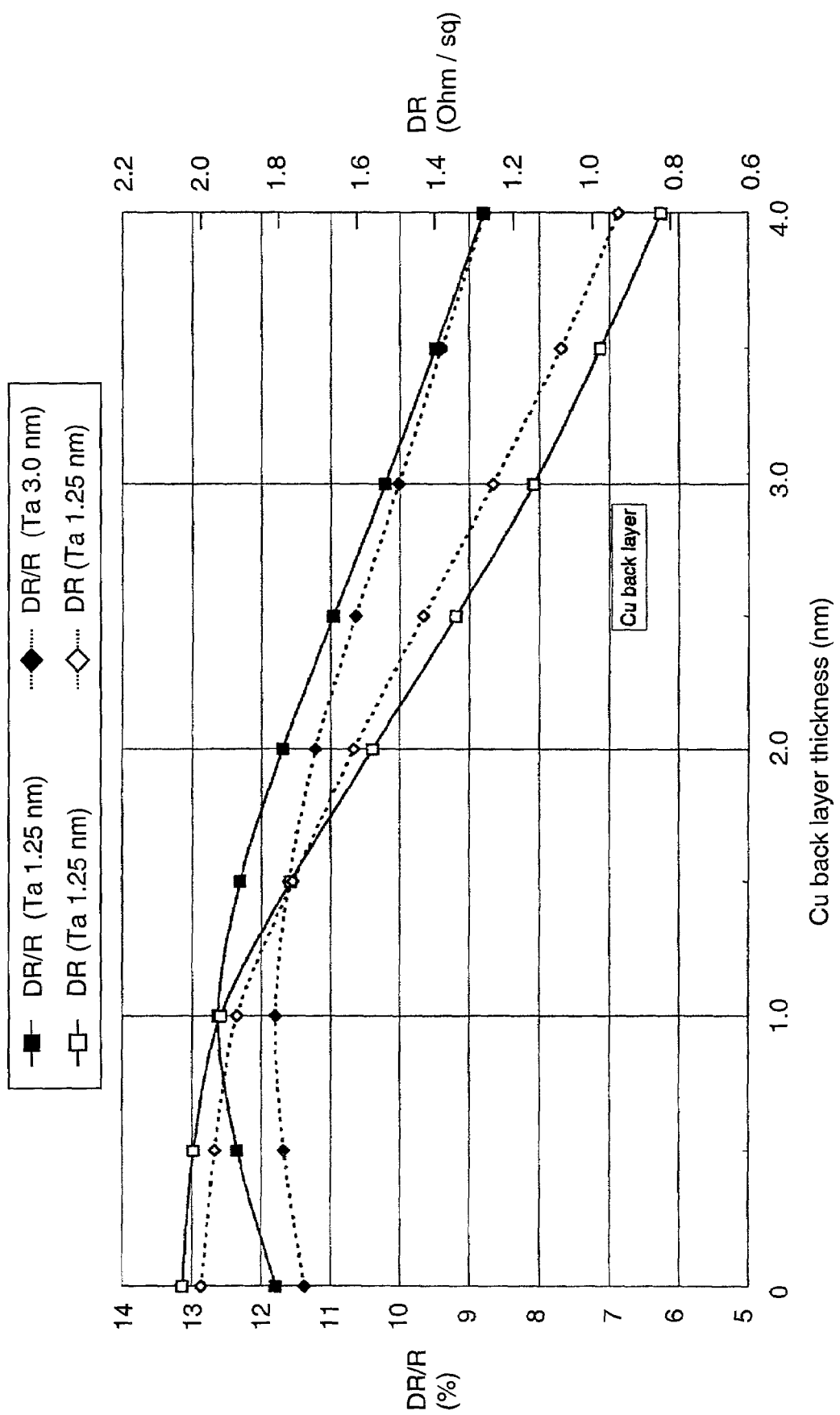
FIG. 7 is a graph showing experimental results obtained for the Cu back layer film thickness dependence of the spin-valve type magnetoresistance sensor of the present invention.
Figure 8:
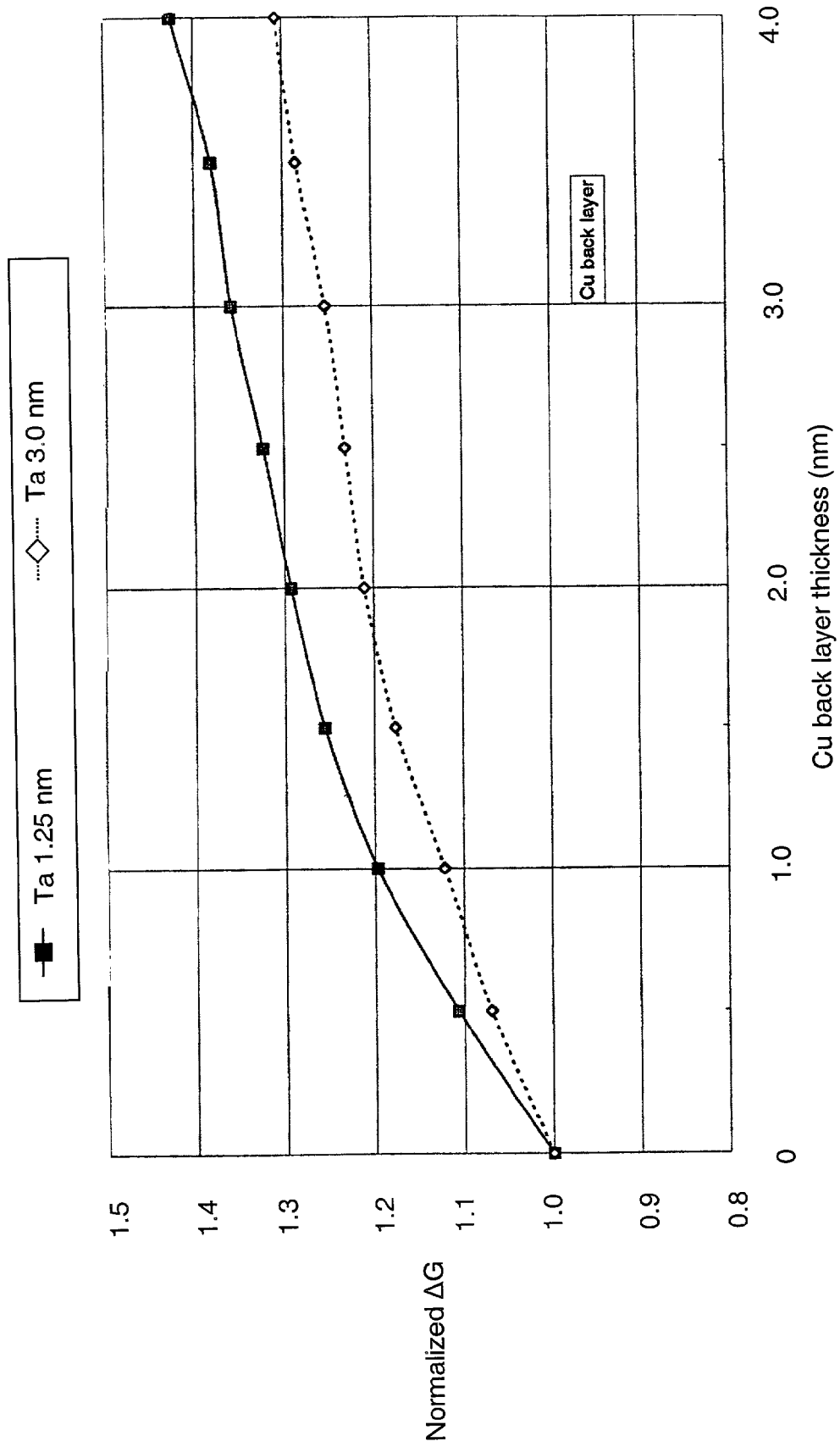
FIG. 8 is another graph showing similar experimental results obtained for the Cu back layer film thickness dependence.

The results obtained are shown in FIGS. 7 and 8. Furthermore, the amounts of change in conductance ΔG shown in FIG. 8 are shown as standardized values.

Referring to FIG. 7, it is seen that when the thickness of the Cu back layer is 0.5 to 1.5 nm, the MR ratio (DR/R) is increased compared to the ratio obtained when there is no back layer, both in the case of a 1.25 nm Ta film and in the case of a 3.0 nm Ta film. Furthermore, the largest MR ratio was obtained when the Cu back layer had a thickness of 1 nm.

Furthermore, when the Ta film has a thickness of 1.25 nm, the MR ratio obtained is larger than that obtained in the case of a Ta film thickness of 3.0 nm, and the rate of increase in the MR ratio is also larger. It is seen from this that when the thickness of the Ta film is 1.25 nm, all of the tantalum is oxidized so that the film functions reliably as an electron-reflective layer, thus contributing greatly to the increase in the MR ratio.

Next, referring to FIG. 8, it is seen that when the thickness of the Ta film is 1.25 nm, current tends to flow more readily than when the thickness is 3.0 nm. Accordingly, electrons are effectively reflected when the thickness of the Ta film is 1.25 nm. This contribution appears in the higher MR ratio that is seen when the thickness of the Ta film is 1.25 nm.

Furthermore, when the thickness of the Cu back layer is approximately 2.0 nm or greater, no great difference in characteristics is seen between a Ta film thickness of 1.25 mu and a Ta film thickness of 3.0 nm. The apparent reason for this is that when the thickness of the Cu back layer is large, the contribution of the film thickness is greater than the contribution of electron reflection.

As is clear from the abovementioned description, the spin-valve type magnetoresistance sensor of the present invention can manifest a large MR effect as a result of the action of an electron-reflective layer, so that a high playback output can be obtained. In addition, as a result of the electron-reflective layer being stacked with a back layer interposed, favorable soft magnetic characteristics of the free layer can be maintained, so that the operation of the head can be stabilized, and a high recording density may be realized in magnetic recording by utilizing the present invention as a playback thin-film magnetic head in a magnetic recording device.

Thus, a method and apparatus for a spin-valve type magnetoresistance sensor having a free and pinned magnetic layer stacked with a non-magnetic interposed layer are disclosed. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A spin-valve type magnetoresistive sensor comprising:
   a free ferromagnetic layer;
   a pinned ferromagnetic layer;
   a non-magnetic spacer layer sandwiched between the free ferromagnetic layer and the pinned ferromagnetic layer;
   an anti-ferromagnetic layer disposed adjacent to the pinned ferromagnetic layer;
   a non-magnetic back layer disposed adjacent to the free ferromagnetic layer on a side of the free ferromagnetic layer opposite the non-magnetic spacer layer; and
   an electron-reflective layer disposed adjacent to the back layer on a side of the non-magnetic back layer opposite the free ferromagnetic layer, the electron-reflective layer comprising a tantalum oxide film formed from a tantalum layer having a thickness within a range of approximately 0.5 to 1.75 nm.

2. The sensor of claim 1, wherein the non-magnetic back layer has a thickness within a range of approximately 0.5 to 1.5 nm.

3. The sensor of claim 1, wherein the non-magnetic back layer comprises Cu.

4. An apparatus for sensing magnetic flux comprising:
 a spin-valve type magnetoresistive sensor having:
  a free ferromagnetic layer;
  a pinned ferromagnetic layer;
  a non-magnetic spacer layer sandwiched between the free ferromagnetic layer and the pinned ferromagnetic layer;
  an anti-ferromagnetic layer disposed adjacent to the pinned ferromagnetic layer;
  a non-magnetic back layer disposed adjacent to the free ferromagnetic layer on a side of the free ferromagnetic layer opposite the non-magnetic spacer layer; and
  an electron-reflective tantalum oxide layer disposed adjacent to the non-magnetic back layer on a side of the non-magnetic back layer opposite the free ferromagnetic layer.

5. A spin-valve magnetoresistive sensor, comprising:
 a free magnetic layer;
 a pinned magnetic layer;
 a nonmagnetic spacer layer disposed between the free magnetic layer and the pinned magnetic layer;
 an antiferromagnetic layer adjacent to the pinned magnetic layer, the pinned magnetic layer pinned by the antiferromagnetic layer; and
 a non-magnetic back layer disposed adjacent to the free magnetic layer, the free magnetic layer adjoining and being disposed between the non-magnetic back layer and the nonmagnetic spacer layer, the non-magnetic back layer having a thickness within a range of approximately 0.5 to 1.5 nm;
 an electron-reflective layer that adjoins the non-magnetic back layer on a side of the non-magnetic back layer opposite the free magnetic layer, wherein the electron-reflective layer comprises a tantalum oxide film.

6. The spin-valve magnetoresistive sensor of claim 5, wherein the tantalum oxide film is formed from a tantalum layer having a thickness within a range of approximately 0.5 to 1.75 nm.

7. The spin-valve magnetoresistive sensor of claim 5, wherein the non-magnetic back layer comprises two or more non-magnetic metal layers.

* * * * *